United States Patent [19]

Nather et al.

[11] Patent Number: 5,706,177
[45] Date of Patent: Jan. 6, 1998

[54] MULTI-TERMINAL SURFACE-MOUNTED ELECTRONIC DEVICE

[75] Inventors: Heinz Nather, Untergruppenbach; Peter Mühleck, Offenau, both of Germany

[73] Assignee: Temic Telefunken microelectronic GmbH, Heilbronn, Germany

[21] Appl. No.: 569,995

[22] Filed: Dec. 8, 1995

[30] Foreign Application Priority Data

Dec. 24, 1994 [DE] Germany .................. 44 46 566.1

[51] Int. Cl.$^6$ ............................................. H05K 1/16
[52] U.S. Cl. .................. 361/768; 174/260; 257/693; 361/773
[58] Field of Search ..................... 174/260, 52.1, 174/52.2, 52.3; 257/680, 681, 690, 693; 361/379, 647, 703, 760, 767, 768, 774, 772, 773, 783, 707

[56] References Cited

U.S. PATENT DOCUMENTS

| | | |
|---|---|---|
| 4,478,588 | 10/1984 | Lockard . |
| 4,574,297 | 3/1986 | Shiro Ooi ..................... 357/68 |
| 4,890,383 | 1/1990 | Lumbard et al. . |
| 4,959,900 | 10/1990 | de Givry ....................... 29/840 |
| 5,147,982 | 9/1992 | Steffen ......................... 174/52.2 |
| 5,262,925 | 11/1993 | Matta ........................... 361/783 |
| 5,357,056 | 10/1994 | Nagano . |
| 5,386,342 | 1/1995 | Rostoker ....................... 361/749 |
| 5,436,492 | 7/1995 | Yamanaka ...................... 257/433 |
| 5,446,623 | 8/1995 | Kanetake ....................... 361/760 |
| 5,448,387 | 9/1995 | Kurokawa ...................... 359/88 |
| 5,459,641 | 10/1995 | Kuriyama ...................... 361/760 |
| 5,461,539 | 10/1995 | Kuriyama ...................... 361/534 |

FOREIGN PATENT DOCUMENTS

| | | |
|---|---|---|
| 0 205 360 | 12/1986 | European Pat. Off. . |
| 0621 633 | 10/1994 | European Pat. Off. . |
| 24 58 305 | 7/1976 | Germany . |
| 3412492 | 3/1985 | Germany . |
| 86 09 489 | 11/1986 | Germany . |
| 86 33 533 | 5/1987 | Germany . |
| 3811895 | 2/1989 | Germany . |
| 3813435 | 11/1989 | Germany . |
| 42 42 842 | 8/1993 | Germany . |
| 82/02980 | 9/1982 | WIPO . |

OTHER PUBLICATIONS

Sinnadurai, F.N.: Handbook of Microelectronics Packaging and Innerconnection Technologies, Electrochemical Publications Limited, Ayr, Scotland, 1985, S.65–68.

Siemens Components 28, 1990, H. 6, S. 254.

Möllmer, Frank, Waitl, Günter: Siemens SMT–TOPLED für die Oberflächenmontage. In: Siemens Components 29, 1991, H.5, S. 193–196.

Elektronik 25/26/1981, S. 133.

Primary Examiner—Gerald P. Tolin
Attorney, Agent, or Firm—Spencer & Frank

[57] ABSTRACT

A multi-terminal surface-mounted electronic device with contact surfaces placed entirely or partly around several sides, as well as to a method for manufacturing it. The parts according to the invention allow assembly on a circuit board such as p.c.b. and foil in forward, backward and sideward direction. Previous multi-terminal surface-mounted electronic devices could as a rule be mounted in one direction only. For all other directions such as backwards and sidewards costly special constructions or fundamental changes to the circuit board (printed-circuit board, foil) were necessary. In accordance with the invention, an electronic component is located in a housing and both the electronic component and the housing are joined to a base strip. The base strip provides the terminals whose contact surfaces are so formed that they can embrace the entire housing either completely or partially.

12 Claims, 4 Drawing Sheets

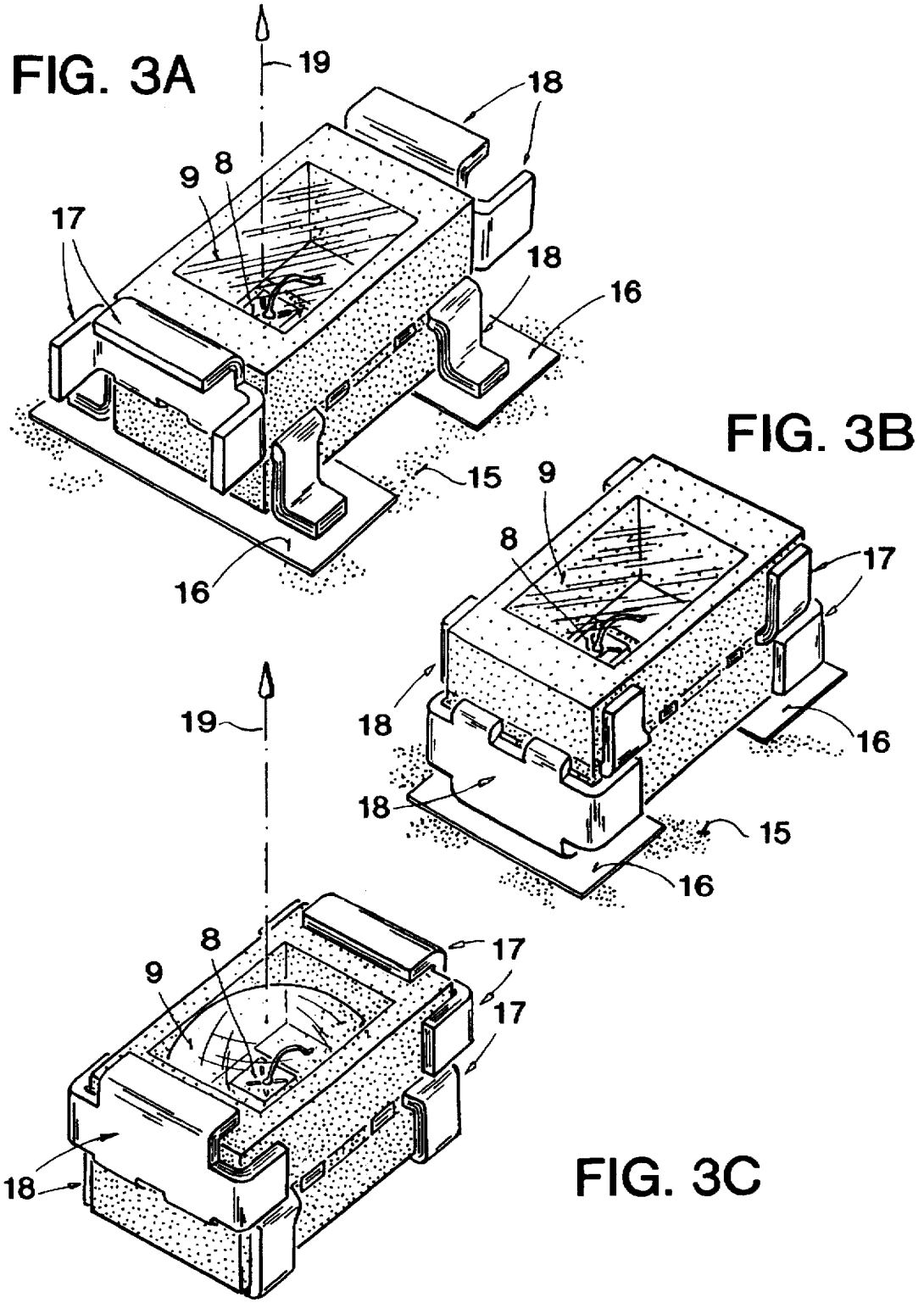

MULTI-TERMINAL SURFACE-MOUNTED ELECTRONIC DEVICE

BACKGROUND OF THE INVENTION

The invention relates to a multi-terminal surface-mounted electronic device comprising a housing, base and electronic component, as well as to a method for manufacturing it.

Multi-terminal surface-mounted electronic devices are known in which an electronic component is situated in a housing and where the device has contact surfaces placed around all or some of the sides thus allowing it to be mounted in several directions.

Thus, ceramic multilayer chip capacitors have separate contact surfaces that are placed around all sides and which embrace at the face end the contacts of a cuboid made up of layers of foil constituting the electrodes and the dielectric. The disadvantage of this construction, however, is that other more sensitive electronic devices, such as semiconductor chips, require additional mechanical protection in the form of a housing.

Also, chip resistors have contact surfaces on several sides of the housing. A resistance layer is provided here on a ceramic substrate, with the resistance layer being covered with a protective coating. At two opposing ends of the resistive layer there are internal contact surfaces which touch the external end contacts. The end contact is bent in clip form over the ceramic substrate and the protective coating which covers the resistor layer. Here too, however, it is a disadvantage that the protective coating offers inadequate protection for more sensitive components, for example, in order to protect a bonding wire.

Tantalum chip capacitors and capacitors with solid electrolytes of SMD design also have contact surfaces that are placed on all sides and which can be mounted on a cuboidal device at a later time. Here, the contact between external contact surface placed on all sides and internal terminal is established by touching. However, components of such design can be equipped with semiconductor chips only with much effort and at high cost. Furthermore, an additional housing would be necessary in order to ensure adequate protection for a component that is sensitive with respect to mechanical stress.

Another disadvantage is that a construction of this kind does not allow optical parts, such as a reflector or a lens, to be incorporated in order to emit or receive a directional beam, as would be necessary for optoelectronic components for example.

Further disadvantages result from the form of the terminals which can only be placed against the housing and cannot project from the housing in the form of wings (gullwing terminals).

Other SMD kinds of devices are also known, such as SOT23 and PLCC2, that incorporate sensitive optoelectronic semiconductor chips. The applications of such devices are, however, extremely limited. As a rule, these can be mounted in only one direction on a printed-circuit board. Such components cannot be mounted in such a way as to radiate in several directions. The disadvantages in this case are high production and handling costs because for different applications (forward, backward and sideward emitters) different versions must be manufactured on different production lines with different materials.

SUMMARY OF THE INVENTION

The object of the invention is to provide a multi-terminal electronic device that can be surface-mounted in several directions and which also by simple means satisfies all the usual requirements of SMD technology with respect to attachment versions (wing-type terminals or terminals located on the housing; solder or bonding terminals) and which at the same time features a slim depth and high performance and to which an extremely high range of electronic components can be fitted.

Another object of the invention is to provide a method for manufacturing the device according to the invention.

According to the invention there is provided a multi-terminal surface-mounted electronic device with contact surfaces placed around all sides or several sides. One or several of the electronic components on this device is enclosed by a housing. The device has a base strip that is made in such a way that the contact surfaces can be deformed so as to cover at least three planes of the housing.

The advantages obtained with the invention are the universal possibilities of application, the low-cost construction, the small dimensions, the high performance achieved, and the simple manufacturing method.

The components can be constructed in several different directions and can include a broad range of electronic components.

In advantageous forms of development of the invention, the contact surfaces can be bent either in the form of a clip towards the inside or in wing form towards the outside.

Furthermore, due to the large contact surfaces and the material selected for the base strip (e.g.: silver-plated, gold-plated, . . . ), a component of this kind can be bonded or soldered or tinned.

Also, an optical housing can be made equipped with a reflector such that an optoelectronic semiconductor chip in the reflector can also be covered by a lens or the potting material be mixed with diffuser such that different angles of radiation result.

The manufacturing method for such a component is the same as for a conventional surface-mounted device which until now could only be aligned in one direction and consists of a base strip and a housing as is usually the case with LEDs in the PLCC2 housing. Existing production lines can therefore continue to be used because only the separation of the contact surfaces from the base strip and the bending become different.

BRIEF DESCRIPTION OF THE DRAWINGS

The invention will now be described and explained on the basis of embodiment examples together with the drawings wherein:

FIG. 3a shows another version of a device according to the invention with wing-shaped shaped contact surfaces bent away from each other;

FIG. 3b shows another version of a device according to the invention with contact surfaces placed around only some of the sides;

FIG. 3c shows another version of a device according to the invention with lens-shaped potting.

DETAILED DESCRIPTION OF THE PREFERRED EMBODIMENTS

Figure 1A:
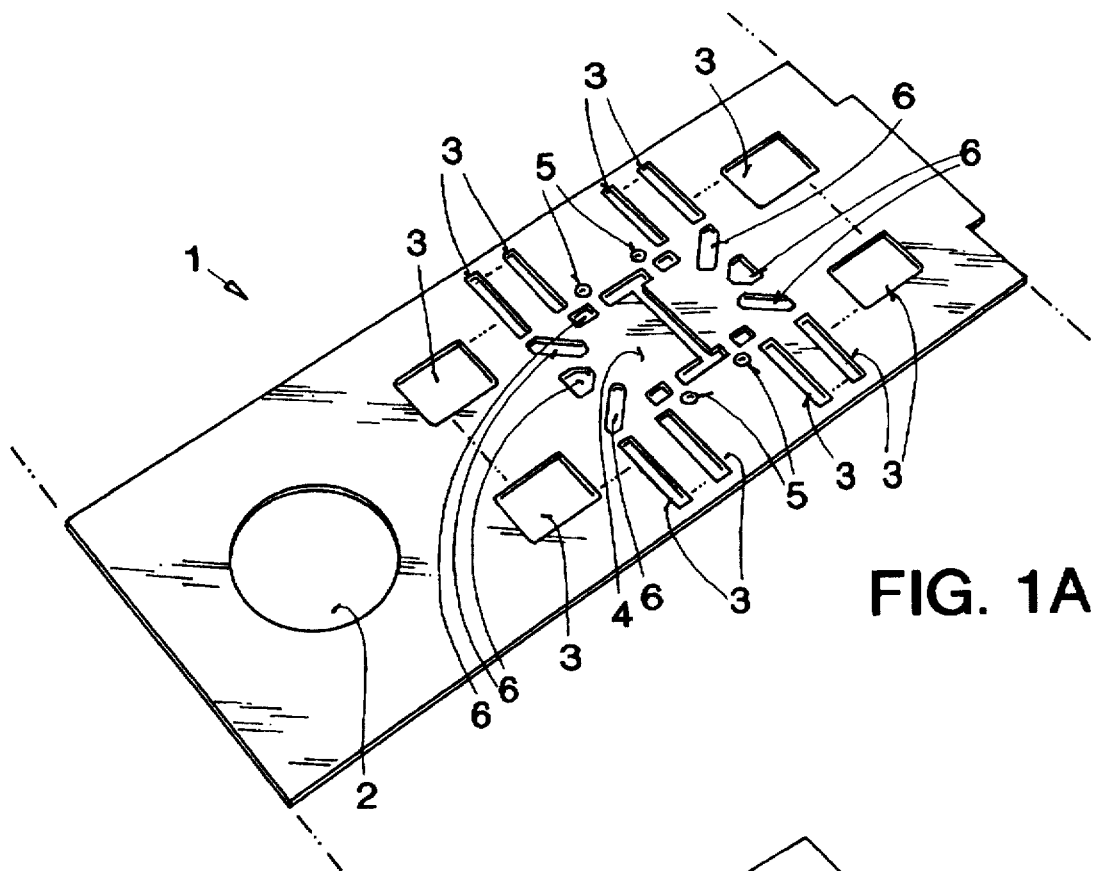
FIG. 1a shows a base strip for making a device according to the invention

In FIG. 1a, a base strip 1 is shown that is used to make a device according to the invention. Apart from a location mark 2, the base strip has several separation cutouts 3 for forming the later contact surface (broken line). A barrier 4 has already been cut out in the center to separate the terminals. Also, further separation cutouts 5 have been included to separate the entire component on the base strip.

Furthermore, cutouts 6 are provided for fastening a housing on the base. By dividing up the contact surfaces further, more than two-terminal versions can also be made (not shown in the Figures).

Figure 1B:
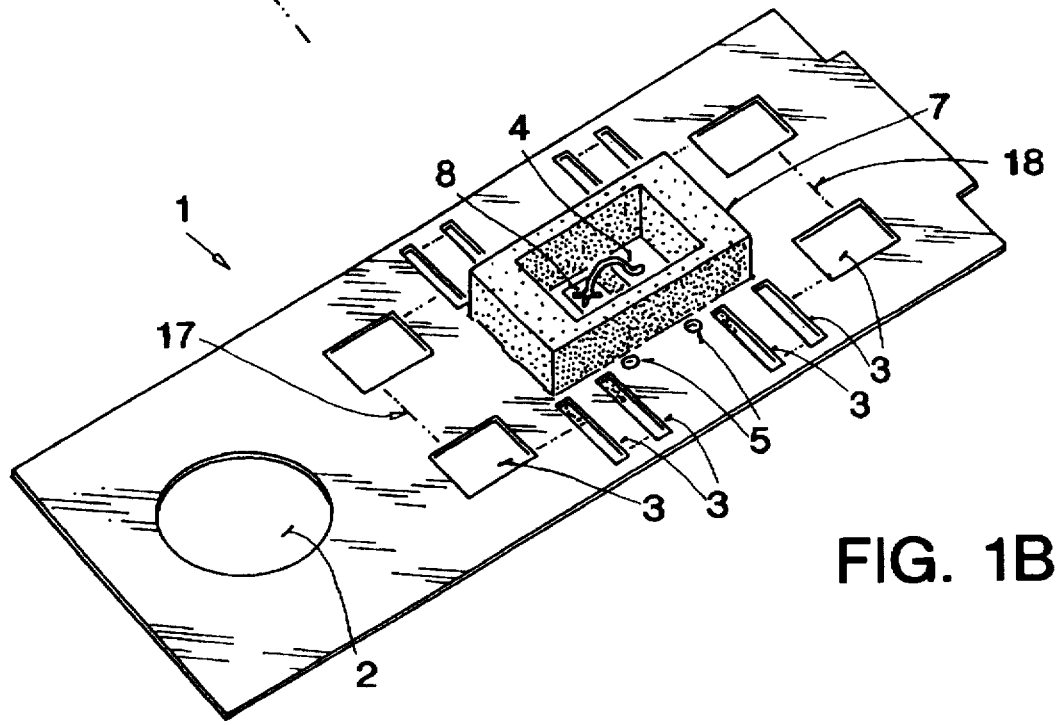
FIG. 1b shows a base strip to which the housing and a semiconductor chip is joined.

In FIG. 1b, a housing 7 has been joined to the base strip 1; this can be accomplished by molding on all sides with a reflecting plastic material or by clipping together the plastic parts at the cutouts 6. In the housing 7 there is an opening that resembles a reflector. An optoelectronic semiconductor chip 8 is joined here to the two terminals of base 1 by adhesion or suchlike and by a bonding wire or suchlike. Other electronic components can also be used here. Both terminals are already separated from each other within the housing (see 4).

Figure 1C:
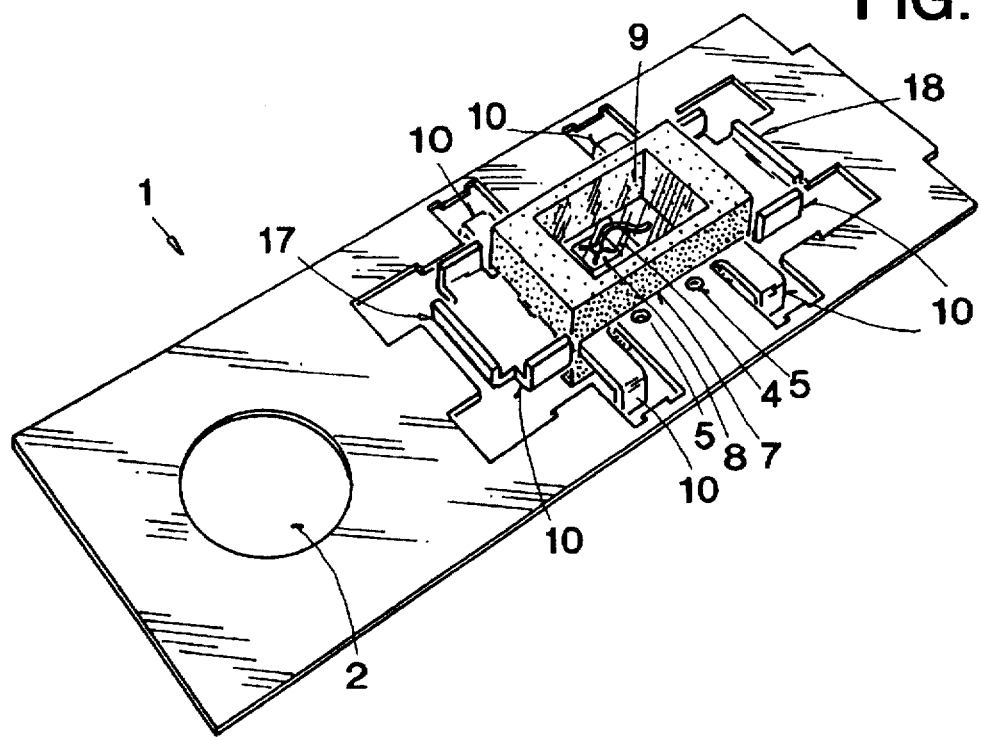
FIG. 1c shows a base strip on which the contact surfaces have in part been separated and the first bending operation has been performed to make the terminals clip-shaped.

In FIG. 1c, the reflector-type opening 9 in the housing is filled with epoxy resin so that the chip is protected against mechanical influences. The opening can either be filled until it has a plane surface as shown in FIG. 1c or the surface can be formed to provide a convex or concave lens. The terminals 17 and 18 can then be shaped. This is done by cutting out the contact surfaces in a stepped form at the separating cutouts 3 (along the broken line shown in FIG. 1a) and by cutting inwards up to the height of the next step. The steps can be bent round by about 90° from the base strip plane in clip form and/or in a winged shape 10.

Figure 1D:
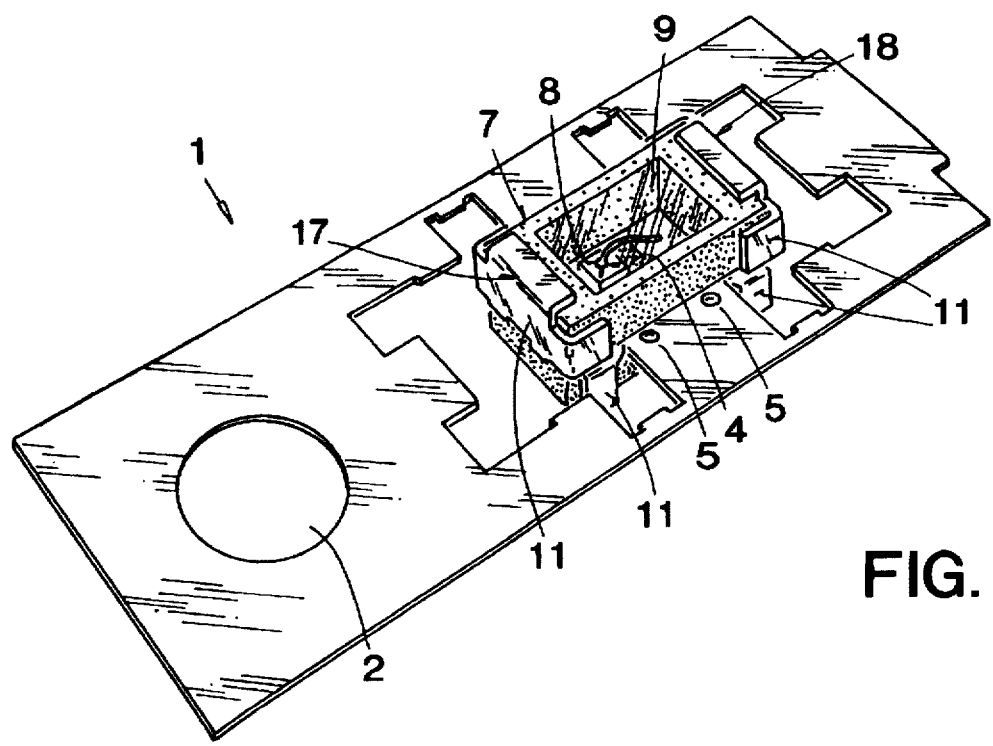
FIG. 1d shows a base strip on which, after the second bending operation, the contact surfaces are placed around all sides of the housing.

In FIG. 1d, the terminals are then bent again by about 90° along the housing, also in the opposing direction, so that two contact surfaces 17, 18 placed around the entire periphery are formed that clasp the housing 7 like a clip and/or project from the housing like a wing (not illustrated). Finally, the component is separated from the base strip 1 at the separating cutouts 5 and at the same time the terminals 17, 18 are separated from one another.

Figure 2:
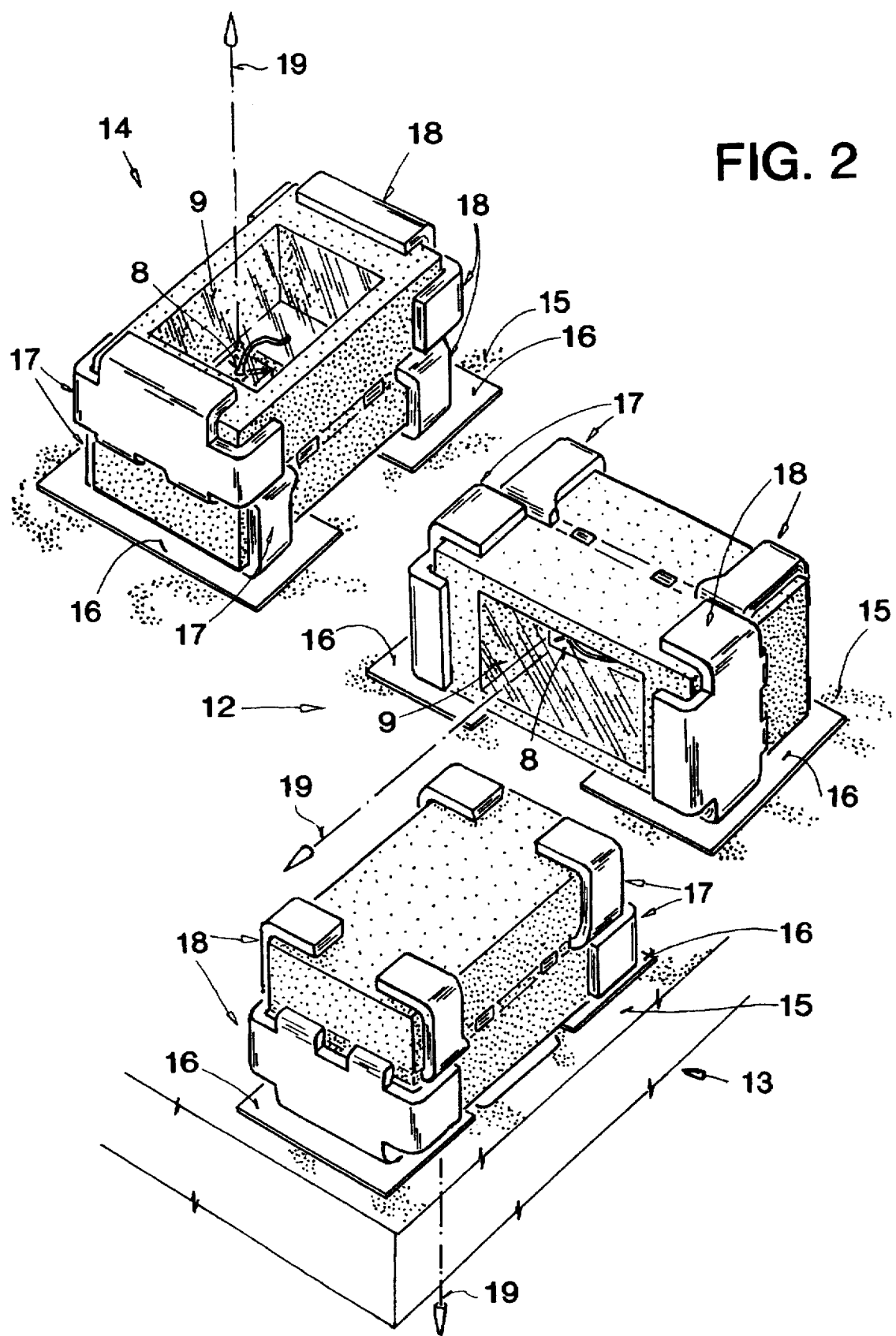
FIG. 2 shows a device according to the invention mounted in a variety of ways on a circuit board.

FIG. 2 shows the various possibilities available when assembling on a circuit board 15 (printed-circuit board, foil). The component is used as a forward emitter 14. The component is joined to the contacts in such a way that the radiation path 19 is perpendicular to the circuit board 15 and the contact 16 is made on the underside of the component. The same component can, however, also be used as sideward emitter 12. The contacts in this component have been provided in such a way that the radiation path 19 is parallel to the circuit board 15 and contact 16 is made on the lateral surface of the component. The component can, however, also be mounted upside down on the circuit board 15 and act as a backward emitter 13. The contacts are then provided in such a way that the radiation is directed through the circuit board, e.g. through a hole. Contact 16 is made on the upper side of the component.

FIG. 3a shows another version of a device according to the invention with wing-shaped contact surfaces 17, 18 bent away from each other that increase the mounting surface of the component or which can also act as cooling fins. Naturally, the terminals can also be bent in such a way that a portion of them project away from the housing in wing form while the remaining portion bears against the housing.

FIG. 3b shows another version in which the contact surface does not quite extend over all sides so that the component can only be mounted as forward and sideward emitter. Naturally, the contact surfaces can be formed in such a way that the other versions can also be made with contact surfaces placed around only some of the sides (backward—sideward and forward—backward)

FIG. 3c shows another version of a device according to the invention in which the opening has not been filled level with epoxy resin but in which a lens 9 can be created. This allows the emission angle to be altered. The lens can be either concave or convex.

What is claimed is:

1. A multi-terminal surface-mounted electronic device comprising a housing, a base strip on which the housing is mounted and at least one electronic component disposed in the housing and connected to the base strip, with the base strip including at least two contact surfaces for making a mechanical and an electrical connection between the device and a printed circuit board, with the at least two contact surfaces being separated from each other and with each extending along at least three planes which are perpendicular to each other and which define outer surfaces the housing.

2. A multi-terminal surface-mounted electronic device in accordance with claim 1, wherein the housing has a reflector type of opening in the center of which the at least one electronic component is located.

3. A multi-terminal surface-mounted electronic device in accordance with claim 2, wherein the opening is closed by a covering.

4. A multi-terminal surface-mounted electronic device in accordance with claim 3, wherein the covering terminates level with an outer surface of the housing.

5. A multi-terminal surface-mounted electronic device in accordance with claim 1, wherein the at least two contact surfaces are clip-shaped and engage at least respective opposite outer side surfaces of the housing.

6. A multi-terminal surface-mounted electronic device in accordance with claim 1, wherein the at least two contact surfaces, in part, project in a wing-shape beyond the outer surfaces of the housing.

7. A multi-terminal surface-mounted electronic device in accordance with claim 1, wherein the contacts are at least one of silver-plated, gold-plated or tinned.

8. A multi-terminal surface-mounted electronic device in accordance with claim 1, wherein the at least two separate contact surfaces are step-shaped with at least one step projecting beyond an edge of the housing.

9. A multi-terminal surface-mounted electronic device in accordance with claim 8, wherein at least one of the two contact surface comprises a first and a second of said steps and a portion of the first step and the second step each are bent through approx. 90°.

10. A multi-terminal surface-mounted electronic device in accordance with claim 8, wherein at least one of the contact surfaces comprises a first, a second and a third of said steps and a portion of the first step, a portion of the second step and the third step each are bent through approx. 90° to form a clip-shaped contact.

11. A multi-terminal surface-mounted electronic device in accordance with claim 8, wherein the at least two contact surfaces each are bent through approx. 90° at those places where they beyond an outer surface of the housing.

12. A multi-terminal surface-mounted electronic device in accordance with claim 3, wherein the covering has a lens-shaped curvature.

* * * * *